United States Patent
Zenkyu et al.

(10) Patent No.: US 11,290,154 B2
(45) Date of Patent: Mar. 29, 2022

(54) CONTROL DEVICE, DELAY DIFFERENCE ADJUSTMENT METHOD, AND NON-TRANSITORY COMPUTER READABLE MEDIUM FOR STORING DELAY DIFFERENCE ADJUSTMENT PROGRAM

(71) Applicant: NEC CORPORATION, Tokyo (JP)

(72) Inventors: Ryuji Zenkyu, Tokyo (JP); Eisaku Sasaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/982,286

(22) PCT Filed: Feb. 6, 2019

(86) PCT No.: PCT/JP2019/004312
§ 371 (c)(1),
(2) Date: Sep. 18, 2020

(87) PCT Pub. No.: WO2019/181257
PCT Pub. Date: Sep. 26, 2019

(65) Prior Publication Data
US 2021/0028827 A1    Jan. 28, 2021

(30) Foreign Application Priority Data
Mar. 23, 2018   (JP) .............................. JP2018-055846

(51) Int. Cl.
*H04B 7/0413*    (2017.01)
*H03K 5/135*    (2006.01)
*H04B 7/06*    (2006.01)
*H04B 7/08*    (2006.01)
*H04W 56/00*    (2009.01)

(52) U.S. Cl.
CPC ........... *H04B 7/0413* (2013.01); *H03K 5/135* (2013.01); *H04B 7/0667* (2013.01);
(Continued)

(58) Field of Classification Search
CPC .. H04B 7/0413; H04B 7/0667; H04B 7/0682; H04B 7/084; H04B 7/10; H04B 7/0417;
(Continued)

(56) References Cited

U.S. PATENT DOCUMENTS 7,782,751 B1 *   8/2010   Lee ..................... H04J 11/0063
                                                      370/206
2018/0062825 A1 *   3/2018   Miao ..................... H04B 10/564
2018/0219717 A1   8/2018   Lee et al.

FOREIGN PATENT DOCUMENTS

JP    05-327670 A    12/1993
JP    09-321679 A    12/1997
(Continued)

OTHER PUBLICATIONS

International Search Report for PCT/JP2019/004312, dated Mar. 19, 2019.
(Continued)

Primary Examiner — Fitwi Y Hailegiorgis
(74) Attorney, Agent, or Firm — Sughrue Mion, PLLC

(57) ABSTRACT

A control device causes a first transmission system in a MIMO transmission device to transmit a first transmitting-end clock transmission signal (first transmission signal), causes a second transmission system to transmit a second transmission signal, and causes the first transmission system to transmit a third transmission signal. The control device acquires a first phase value and a second phase value. The first phase value is a phase value of the second transmission signal received in the second reception system operating based on a receiving-end clock signal synchronous with a transmitting-end clock signal by the first transmission signal. The second phase value is a phase value of the third transmission signal received in the second reception system in synchronous operation. The control device calculates a
(Continued)

first correction value for correcting a first delay amount set value of a delay adjustment processing unit based on the first and second phase values.

10 Claims, 6 Drawing Sheets

(52) U.S. Cl.
CPC .......... *H04B 7/0682* (2013.01); *H04B 7/084* (2013.01); *H04W 56/0045* (2013.01)

(58) Field of Classification Search
CPC .. H04B 7/0671; H03K 5/135; H04W 56/0045
USPC ....................................................... 375/267
See application file for complete search history.

(56) References Cited

FOREIGN PATENT DOCUMENTS

| | | |
|---|---|---|
| JP | 2001-168833 A | 6/2001 |
| JP | 2005-348236 A | 12/2005 |
| JP | 2006-325077 A | 11/2006 |
| JP | 2006-352525 A | 12/2006 |
| JP | 2014-027347 A | 2/2014 |
| WO | 2009/069798 A1 | 6/2009 |

OTHER PUBLICATIONS

Japanese Office Communication for JP Application No. 2020-507413 dated Oct. 26, 2021 with English Translation.

* cited by examiner

CONTROL DEVICE, DELAY DIFFERENCE ADJUSTMENT METHOD, AND NON-TRANSITORY COMPUTER READABLE MEDIUM FOR STORING DELAY DIFFERENCE ADJUSTMENT PROGRAM

CROSS REFERENCE TO RELATED APPLICATIONS

This application is a National Stage of International Application No. PCT/JP2019/004312 filed Feb. 6, 2019, claiming priority based on Japanese Patent Application No. 2018-055846 filed Mar. 23, 2018, the disclosure of which is incorporated herein in its entirety by reference.

TECHNICAL FIELD

The present disclosure relates to a control device, a delay difference adjustment method, and a delay difference adjustment program.

BACKGROUND ART

MIMO (multiple-input and multiple-output) transmission technology attracts attention as a higher-capacity technology such as mobile backhaul and mobile fronthaul. In the MIMO transmission, it is desirable to align the timing of transmission in a plurality of transmission antennas in order to prevent degradation of reception accuracy (e.g., Patent Literature 1).

CITATION LIST

Patent Literature

PTL1: International Patent Publication No. WO2009/069798

SUMMARY OF INVENTION

Technical Problem

A transmission radio processing unit that includes a digital-to-analog converter (DAC: digital-to-analog converter) is placed in each of a plurality of transmission systems of a MIMO transmission device. The transmission radio processing unit is generally composed of an analog circuit. Since an analog circuit is different from individual to individual, different delays occur in a plurality of transmission signals that respectively pass through a plurality of transmission radio processing units of a MIMO transmission device. Therefore, in related arts, there is a possibility that the amount of delay in a plurality of transmission systems of a MIMO transmission device is not aligned, and therefore the timing of transmission in a plurality of transmission antennas is not aligned. This can lead to degradation of reception accuracy in MIMO transmission.

An object of the present disclosure is to provide a control device, a delay difference adjustment method, and a delay difference adjustment program capable of increasing reception accuracy in MIMO transmission.

Solution to Problem

A control device according to a first aspect is a control device for adjusting a difference in delay between a first transmission system and a second transmission system in a MIMO (multiple-input and multiple-output) transmission device including the first transmission system and the second transmission system operating based on a transmitting-end clock signal and being capable of MIMO communication with a MIMO reception device including a first reception system and a second reception system operating based on a receiving-end clock signal, the control device including a control unit configured to cause a first transmission radio processing unit in the first transmission system to transmit a first transmitting-end clock transmission signal, cause a second transmission radio processing unit in the second transmission system to transmit a second transmitting-end clock transmission signal, cause the first transmission radio processing unit to transmit a third transmitting-end clock transmission signal, acquire, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculate a first correction value for correcting a first delay amount set value set to a delay adjustment unit placed in an input stage of the second transmission radio processing unit in the second transmission system based on the acquired information about the first phase value and the second phase value.

A delay difference adjustment method according to a second aspect is a delay difference adjustment method performed by a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, the method including causing a first transmission radio processing unit in the first transmission system to transmit a first transmitting-end clock transmission signal, causing a second transmission radio processing unit in the second transmission system to transmit a second transmitting-end clock transmission signal, causing the first transmission radio processing unit to transmit a third transmitting-end clock transmission signal, acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

A delay difference adjustment program according to a third aspect causes a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, to perform processing of causing a first transmission radio processing unit in the first transmission system to transmit a first transmitting-end clock transmission signal, causing a second transmission radio processing unit in the second transmission system to transmit a second transmitting-end clock transmission signal, causing the first transmission radio processing unit to transmit a third transmitting-end clock transmission signal, acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

Advantageous Effects of Invention

According to the present disclosure, there are provided a control device, a delay difference adjustment method, and a delay difference adjustment program capable of increasing reception accuracy in MIMO transmission.

DESCRIPTION OF EMBODIMENTS

Example embodiments are described hereinafter with reference to the drawings. It should be noted that, in the example embodiments, the same or equivalent elements are denoted by the same reference symbols, and the redundant explanation thereof is omitted.

First Example Embodiment

<Overview of Communication System>

Figure 1:
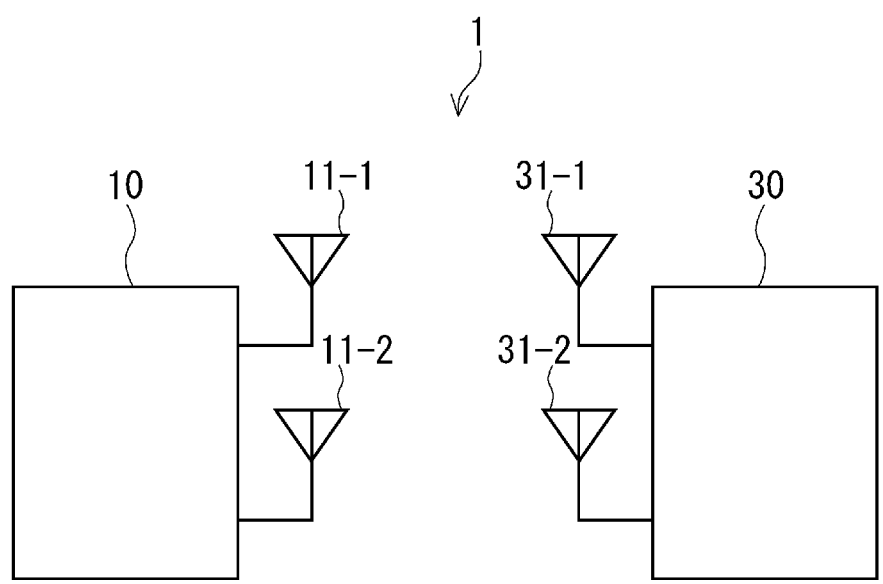
FIG. 1 is a view showing an example of a communication system according to a first example embodiment.

FIG. 1 is a view showing an example of a communication system according to a first example embodiment. In FIG. 1, a communication system 1 includes a MIMO transmission device 10 and a MIMO reception device 30. The MIMO transmission device 10 has antennas 11-1 and 11-2 to be used for MIMO transmission. The antenna 11-1 is included in a "first transmission system" of the MIMO transmission device 10, and the antenna 11-2 is included in a "second transmission system" of the MIMO transmission device 10. The MIMO reception device 30 has antennas 31-1 and 31-2 to be used for MIMO reception. The antenna 31-1 is included in a "first reception system" of the MIMO reception device 30, and the antenna 31-2 is included in a "second reception system" of the MIMO reception device 30. Although the number of antennas to be used for MIMO transmission in the MIMO transmission device 10 and the number of antennas to be used for MIMO reception in the MIMO reception device 30 are two in this example, the number of antennas may be three or more.

The MIMO transmission device 10 performs MIMO transmission of a data signal to the MIMO reception device 30. Note that, however, "calibration" is performed between the MIMO transmission device 10 and the MIMO reception device 30 before MIMO transmission of a data signal in order to adjust the "amount of delay" in a plurality of "transmission systems" of the MIMO transmission device 10. By this "calibration", the amount of delay in the second transmission system is adjusted in such a way that the amount of delay in the first transmission system and the amount of delay in the second transmission system approach the same value.

<Configuration Example of MIMO Transmission Device>

Figure 2:
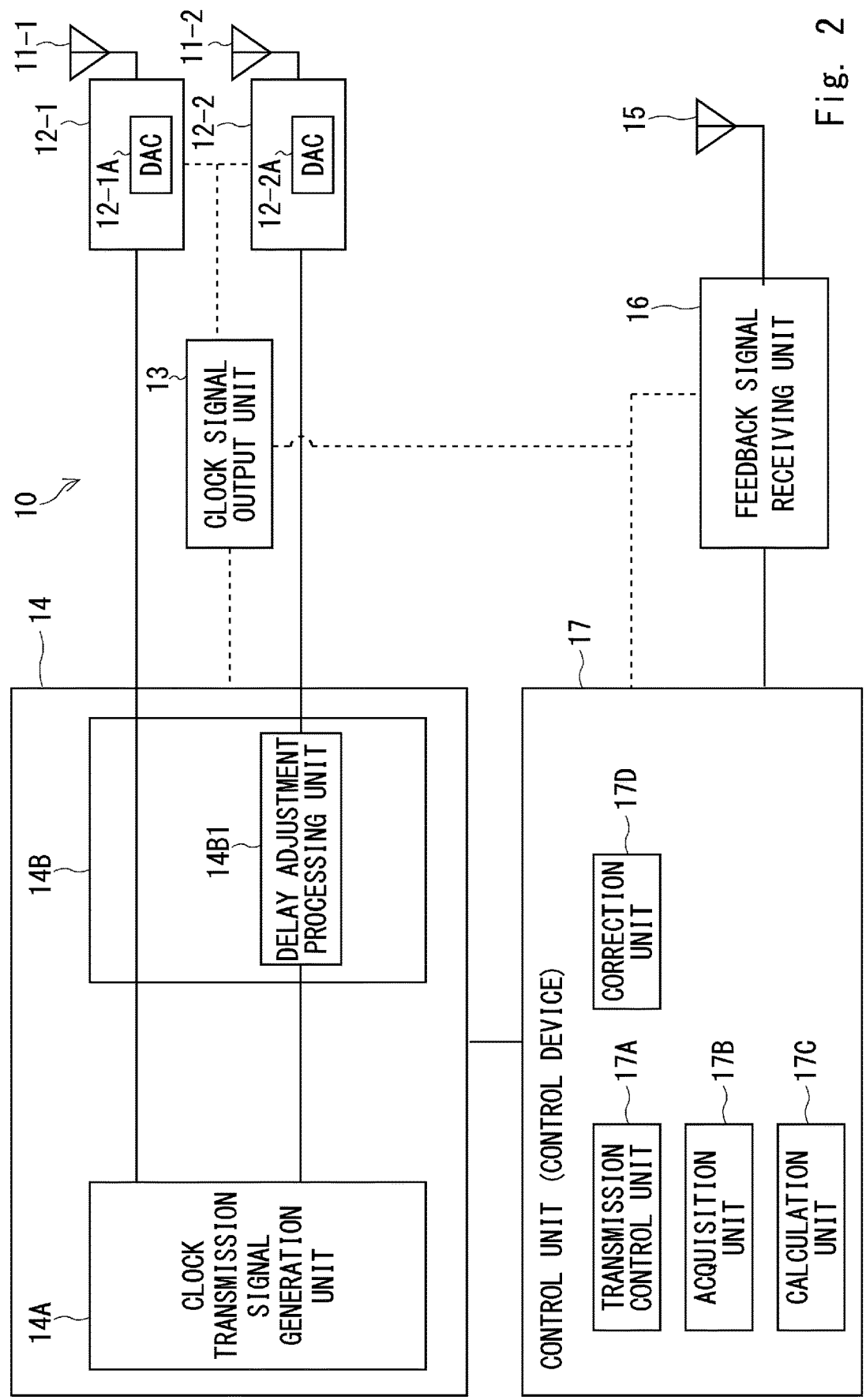
FIG. 2 is a block diagram showing an example of a MIMO transmission device that includes a control device according to the first example embodiment.

FIG. 2 is a block diagram showing an example of a MIMO transmission device that includes a control device according to the first example embodiment. In FIG. 2, the MIMO transmission device 10 includes the antennas 11-1 and 11-2, transmission radio processing units 12-1 and 12-2, a clock signal output unit 13, a signal processing unit 14, an antenna 15, a feedback signal receiving unit 16, and a control unit (control device) 17. The antenna 11-1 and the transmission radio processing unit 12-1 are included in the above-described "first transmission system", and the antenna 11-2, the transmission radio processing unit 12-2, and a delay adjustment processing unit 14B1, which is described later, are included in the above-described "second transmission system".

The clock signal output unit 13 outputs a transmitting-end clock signal. The transmission radio processing units 12-1 and 12-2, the signal processing unit 14, the feedback signal receiving unit 16, and the control unit (control device) 17 operate based on the transmitting-end clock signal that is output from the clock signal output unit 13.

The signal processing unit 14 includes a clock transmission signal generation unit 14A and a delay amount adjustment unit 14B as shown in FIG. 2.

The clock transmission signal generation unit 14A generates a "transmitting-end clock transmission signal" based on the transmitting-end clock signal. The "transmitting-end clock transmission signal" may be a signal that can transmit information about a clock at the transmitting end to the receiving end. The "transmitting-end clock transmission signal" may be a modulation signal where specified data is modulated based on the transmitting-end clock signal, or an unmodulated continuous wave signal that is formed based on the transmitting-end clock signal. The clock transmission signal generation unit 14A outputs the generated "transmitting-end clock transmission signal" to the delay amount adjustment unit 14B.

The delay amount adjustment unit 14B includes the delay adjustment processing unit 14B1. The delay adjustment processing unit 14B1 is included in the "second transmission system" as described above, and it is placed in an input stage of the transmission radio processing unit 12-2 in the "second transmission system". The delay adjustment processing unit 14B1 adjusts the amount of delay of a "transmitting-end clock transmission signal (second transmitting-end clock transmission signal)" that is input to the transmission radio processing unit 12-2 based on a set "delay amount set value (first delay amount set value)". The delay adjustment processing unit 14B1 may have a configuration that includes a shift register having a plurality of stages and capable of switching the number of the stages used, for example, or may have a configuration that includes a linear interpolation circuit. For the linear interpolation circuit, a digital signal processing circuit that implements general linear interpolation such as Lagrange interpolation may be used.

The transmission radio processing units 12-1 and 12-2 transmit a radio signal obtained by performing transmission radio processing on an input signal via the antennas 11-1 and 11-2, respectively. The transmission radio processing units 12-1 and 12-2 include digital-to-analog converters (DAC) 12-1A and 12-2A, respectively. Each of the digital-to-analog converters 12-1A and 12-2A is composed of an analog circuit, and they are likely to be different from each other due to individual differences. Thus, a delay difference occurs between a signal having passed through the transmission radio processing unit 12-1 and a signal having passed through the transmission radio processing unit 12-2. Accordingly, a delay difference occurs between the first transmission system and the second transmission system. Note that the transmission radio processing units 12-1 and 12-2 may include an analog circuit other than the digital-to-analog converters 12-1A and 12-2A.

The feedback signal receiving unit 16 receives, via the antenna 15, a "feedback signal" transmitted via an antenna 36 from the MIMO reception device 30, and outputs it to the control unit 17. By this "feedback signal", information about a "first phase value" and a "second phase value" is fed back from the MIMO reception device 30. The "first phase value" is a phase value of the "second transmitting-end clock transmission signal" received in the second reception system that operates based on a receiving-end clock signal that is synchronous with the transmitting-end clock signal by a "first transmitting-end clock transmission signal". This "first phase value" is a phase value extracted by a clock recovery processing unit (second clock recovery processing unit) in the second reception system, which is described later. The "second phase value" is a phase value of a "third transmitting-end clock transmission signal" received in the second reception system that operates based on the receiving-end clock signal that is synchronous with the transmitting-end clock signal by the "first transmitting-end clock transmission signal". This "second phase value" is a phase value extracted by the clock recovery processing unit (second clock recovery processing unit) in the second reception system, which is described later.

As shown in FIG. 2, the control unit (control device) 17 includes a transmission control unit 17A, an acquisition unit 17B, a calculation unit 17C, and a correction unit 17D.

The transmission control unit 17A causes the transmission radio processing unit 12-1 in the first transmission system to transmit the "transmitting-end clock transmission signal (first transmitting-end clock transmission signal)". Further, the transmission control unit 17A causes the transmission radio processing unit 12-2 in the second transmission system to transmit the "transmitting-end clock transmission signal (second transmitting-end clock transmission signal)". Furthermore, the transmission control unit 17A causes the transmission radio processing unit 12-1 in the first transmission system to transmit the "transmitting-end clock transmission signal (third transmitting-end clock transmission signal)".

The acquisition unit 17B acquires the information about the "first phase value" and the "second phase value" described above from the "feedback signal" received from the feedback signal receiving unit 16.

The calculation unit 17C calculates a "first correction value" for correcting the "first delay amount set value" set to the delay adjustment processing unit 14B1 based on the information about the "first phase value" and the "second phase value" acquired by the acquisition unit 17B. For example, the calculation unit 17C calculates the "first correction value" by subtracting a "second inverted phase value", which is obtained by inverting the positive/negative sign of the "second phase value", from a "first inverted phase value", which is obtained by inverting the positive/negative sign of the "first phase value".

The correction unit 17D corrects the "first delay amount set value" of the delay adjustment processing unit 14B1 by using the "first correct value" calculated by the calculation unit 17C, and sets a new "first delay amount set value" to the delay adjustment processing unit 14B1. Ideally, this correction by the correction unit 17D makes the amount of delay in the first transmission system and the amount of delay in the second transmission system equal to each other.

<Configuration Example of MIMO Reception Device>

Figure 3:
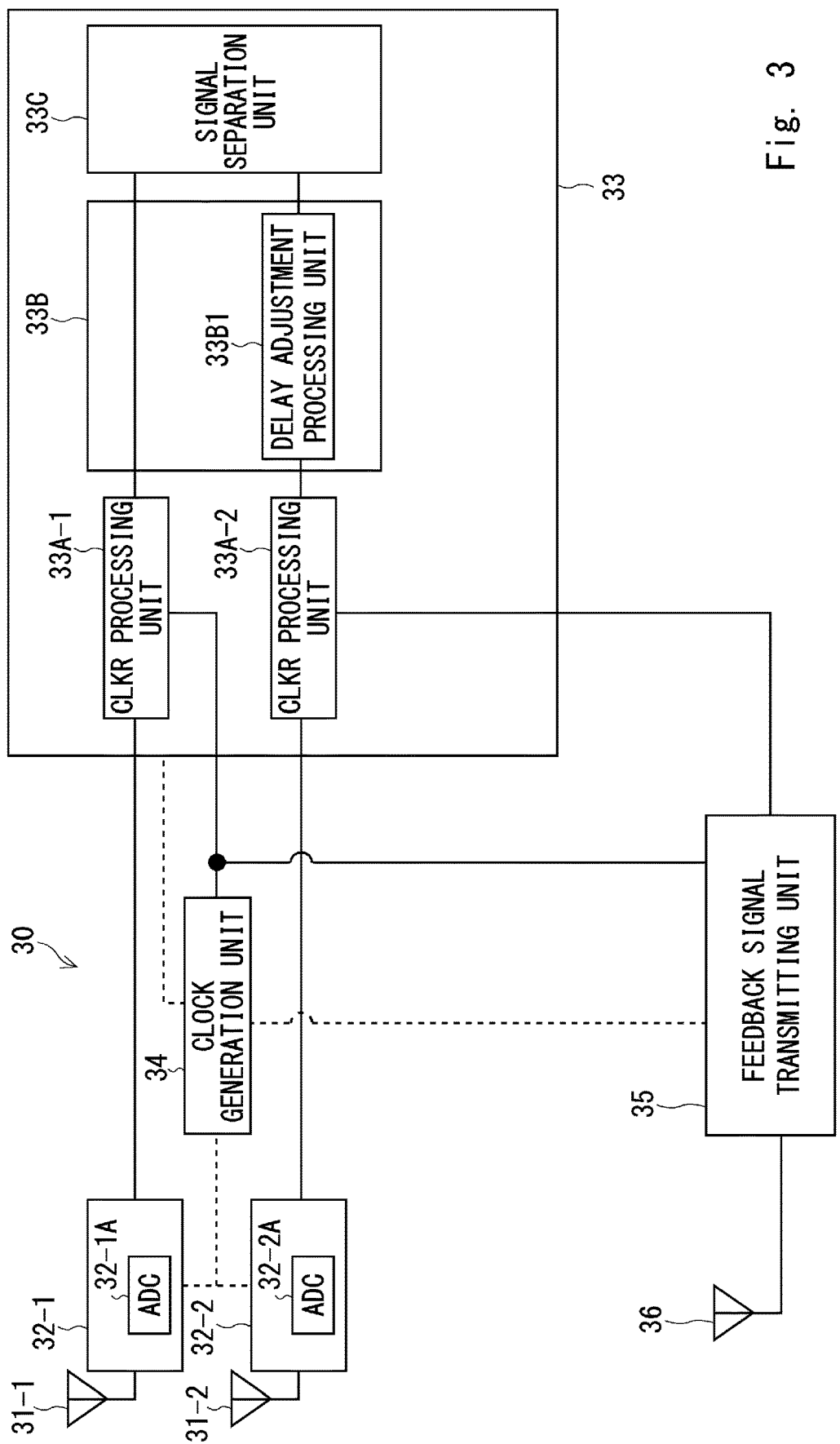
FIG. 3 is a block diagram showing an example of a MIMO reception device according to the first example embodiment.

FIG. 3 is a block diagram showing an example of a MIMO reception device according to the first example embodiment. In FIG. 3, the MIMO reception device 30 includes antennas 31-1 and 31-2, reception radio processing units 32-1 and 32-2, a signal processing unit 33, a clock generation unit 34, a feedback signal transmitting unit 35, and the antenna 36. The antenna 31-1, the reception radio processing unit 32-1, and a clock recovery processing unit 33A-1, which is described later, are included in the above-described "first reception system". The antenna 31-2, the reception radio processing unit 32-2, and a clock recovery processing unit 33A-2 and a delay adjustment processing unit 33B1, which are described later, are included in the above-described "second reception system".

The reception radio processing units 32-1 and 32-2 output, to the signal processing unit 33, signals after reception radio processing, which are obtained by performing reception radio processing on signals received via the antennas 31-1 and 31-2, respectively. The reception radio processing units 32-1 and 32-2 include analog-to-digital converters (ADC) 32-1A and 32-2A, respectively. Each of the analog-to-digital converters 32-1A and 32-2A is composed of an analog circuit, and they are likely to be different from each other due to individual differences. Thus, a delay difference occurs between a signal having passed through the analog-to-digital converter 32-1A and a signal having passed through the analog-to-digital converter 32-2A. Accordingly, a delay difference occurs between the first reception system and the second reception system. Note that the reception radio processing units 32-1 and 32-2 may include an analog circuit other than the analog-to-digital converters 32-1A and 32-2A.

The clock generation unit 34 receives a phase value of the "first transmitting-end clock transmission signal" from the clock recovery processing unit 33A-1, which is described later, and generates a receiving-end clock signal based on an inverted phase value obtained by inverting the positive/negative sign of this phase value of the "first transmitting-end clock transmission signal". The generated receiving-end clock signal is synchronous with the above-described transmitting-end clock signal. This receiving-end clock signal that is synchronous with the transmitting-end clock signal is output to the reception radio processing units 32-1 and 32-2, the signal processing unit 33, and the feedback signal transmitting unit 35. The clock generation unit 34 includes a PLL (Phase Locked Loop) circuit, for example.

The signal processing unit 33 includes clock recovery (CLKR) processing units 33A-1 and 33A-2, a delay amount adjustment unit 33B, and a signal separation unit 33C as shown in FIG. 3.

The clock recovery processing unit 33A-1 receives the "first transmitting-end clock transmission signal" transmitted from the "first transmission system" via the antenna 31-1 and the reception radio processing unit 32-1. Then, the clock recovery processing unit 33A-1 extracts a phase value of the received "first transmitting-end clock transmission signal". For this extraction of the phase value, an eye pattern of I-signal or Q-signal of the "first transmitting-end clock transmission signal" may be used. The clock recovery processing unit 33A-1 then outputs the extracted phase value of the "first transmitting-end clock transmission signal" to the clock generation unit 34. The receiving-end clock signal that is synchronous with the transmitting-end clock signal is thereby output from the clock generation unit 34 as described above, and the clock recovery processing unit 33A-1 operates (which is "synchronous operation") based on this synchronous receiving-end clock signal. The reception radio processing units 32-1 and 32-2, the signal processing unit 33, and the feedback signal transmitting unit 35, which receive the receiving-end clock signal that is synchronous with the transmitting-end clock signal, also perform "synchronous operation".

The clock recovery processing unit 33A-2 that is in "synchronous operation" receives the "second transmitting-end clock transmission signal" transmitted from the "second transmission system" via the antenna 31-2 and the reception radio processing unit 32-2. Then, the clock recovery processing unit 33A-2 extracts a phase value (which is hereinafter referred to as a "first phase value") of the received "second transmitting-end clock transmission signal". The clock recovery processing unit 33A-2 then outputs the extracted "first phase value" to the feedback signal transmitting unit 35. This information about the "first phase value" is transmitted to the MIMO transmission device 10 by the feedback signal transmitting unit 35.

The clock recovery processing unit 33A-2 that is in "synchronous operation" receives the "third transmitting-end clock transmission signal" transmitted from the "first transmission system" via the antenna 31-2 and the reception radio processing unit 32-2. Then, the clock recovery processing unit 33A-2 extracts a phase value (which is hereinafter referred to as a "second phase value") of the received "third transmitting-end clock transmission signal". The clock recovery processing unit 33A-2 then outputs the extracted "second phase value" to the feedback signal transmitting unit 35 and the delay adjustment processing unit 33B1, which is described later. This information about the "second phase value" is transmitted to the MIMO transmission device 10 by the feedback signal transmitting unit 35.

The delay amount adjustment unit 33B includes the delay adjustment processing unit 33B1. The delay adjustment processing unit 33B1 adjusts the amount of delay of an input signal based on a "delay amount set value", and outputs it to the signal separation unit 33C. The delay adjustment processing unit 33B1 uses, as the "delay amount set value", the "second inverted phase value" obtained by inverting the positive/negative sign of the "second phase value" received from the clock recovery processing unit 33A-2.

The signal separation unit 33C separates data signals transmitted by MIMO from a plurality of transmission systems of the MIMO transmission device 10 and received by a plurality of reception systems.

The feedback signal transmitting unit 35 transmits the above-described information about the "first phase value" and the "second phase value" as a feedback signal to the MIMO transmission device 10 via the antenna 36.

<Operation Example of Communication System>

An example of the processing operation of the communication system 1 having the above configuration is described hereinafter. In the following example, a processing operation in "calibration" is described.

It is assumed that the amount of delay in the transmission radio processing unit 12-1 is $\Delta S1$, and the amount of delay in the transmission radio processing unit 12-2 is $\Delta S2$. Thus, before "calibration" is performed, the amount of delay in the first transmission system is $\Delta S1$, and the amount of delay in the second transmission system is $\Delta S2$. It is also assumed that the amount of delay in the reception radio processing unit 32-1 is $\Delta t1$, and the amount of delay in the reception radio processing unit 32-2 is $\Delta t2$. Further, the following description is based on the assumption that there is no difference in delay between a plurality of space propagation paths.

The control unit (control device) 17 of the MIMO transmission device 10 resets the delay amount set value of the delay adjustment processing unit 14B1 at the start of "calibration", though not limited thereto. In other words, it sets the delay amount set value of the delay adjustment processing unit 14B1 to zero.

Then, the control unit (control device) 17 of the MIMO transmission device 10 causes the transmission radio processing unit 12-1 in the first transmission system to transmit the "first transmitting-end clock transmission signal".

Then, the clock recovery processing unit 33A-1 in the MIMO reception device 30 receives the "first transmitting-end clock transmission signal" transmitted from the "first transmission system" via the antenna 31-1 and the reception radio processing unit 32-1. The "first transmitting-end clock transmission signal" transmitted from the "first transmission system" is delayed by the amount of delay "$\Delta S1 + \Delta t1$" and received by the clock recovery processing unit 33A-1. Thus, the clock recovery processing unit 33A-1 extracts "$\Delta S1 + \Delta t1$" as a phase value of the "first transmitting-end clock transmission signal".

The clock generation unit 34 then receives the phase value "$\Delta S1 + \Delta t1$", and generates a receiving-end clock signal based on the inverted phase value "$-(\Delta S1 + \Delta t1)$". As described above, the generated receiving-end clock signal is synchronous with the transmitting-end clock signal.

After that, the control unit (control device) 17 in the MIMO transmission device 10 causes the transmission radio processing unit 12-2 in the "second transmission system" to transmit the "second transmitting-end clock transmission signal".

Then, the clock recovery processing unit 33A-2 in the MIMO reception device 30, which is in "synchronous operation", receives the "second transmitting-end clock transmission signal" transmitted from the "second transmission system" via the antenna 31-2 and the reception radio processing unit 32-2. The clock recovery processing unit 33A-2 is in "synchronous operation". Therefore, the "second transmitting-end clock transmission signal" transmitted from the "second transmission system" is delayed by the amount of delay "$(\Delta S2+\Delta t2)-(\Delta S1+\Delta t1)$" and received by the clock recovery processing unit 33A-2. Thus, the clock recovery processing unit 33A-2 extracts "$(\Delta S2+\Delta t2)-(\Delta S1+\Delta t1)$" as the "first phase value" of the "second transmitting-end clock transmission signal".

The feedback signal transmitting unit 35 then transmits information about the "first phase value" to the MIMO transmission device 10. The transmitted information about the "first phase value" is acquired by the control unit 17 via the antenna 15 and the feedback signal receiving unit 16.

Then, the control unit (control device) 17 in the MIMO transmission device 10 causes the transmission radio processing unit 12-1 in the first transmission system to transmit the "third transmitting-end clock transmission signal".

The clock recovery processing unit 33A-2 that is in "synchronous operation" receives the "third transmitting-end clock transmission signal" transmitted from the "first transmission system" via the antenna 31-2 and the reception radio processing unit 32-2. The clock recovery processing unit 33A-2 is in "synchronous operation". Therefore, the "third transmitting-end clock transmission signal" transmitted from the "first transmission system" is delayed by the amount of delay "$(\Delta t2-\Delta t1)(=\Delta S1+\Delta t2)-(\Delta S1+\Delta t1))$" and received by the clock recovery processing unit 33A-2. Thus, the clock recovery processing unit 33A-2 extracts "$\Delta t2-\Delta t1$" as the "second phase value" of the "third transmitting-end clock transmission signal".

The feedback signal transmitting unit 35 then transmits information about the "second phase value" to the MIMO transmission device 10. The transmitted information about the "second phase value" is acquired by the control unit 17 via the antenna 15 and the feedback signal receiving unit 16. Further, the delay adjustment processing unit 33B1 uses, as the "delay amount set value", the "second inverted phase value" obtained by inverting the positive/negative sign of the "second phase value" received from the clock recovery processing unit 33A-2. This allows the amount of delay in the first transmission system and the amount of delay in the second transmission system to be equal.

After that, the control unit (control device) 17 in the MIMO transmission device 10 calculates the "first correction value" for correcting the "first delay amount set value" that is set to the delay adjustment processing unit 14B1 based on the acquired information about the "first phase value" and the "second phase value". To be specific, the calculation unit 17C calculates the "first correction value" by subtracting the "second inverted phase value", which is obtained by inverting the positive/negative sign of the "second phase value", from the "first inverted phase value", which is obtained by inverting the positive/negative sign of the "first phase value". With use of the first phase value "$(\Delta S2+\Delta t2)-(\Delta S1+\Delta t1)$" and the second phase value "$\Delta t2-\Delta t1$" described above, the "first correction value" is "$-(\Delta S2-\Delta S1)$".

Then, the control unit (control device) 17 in the MIMO transmission device 10 corrects the "first delay amount set value" of the delay adjustment processing unit 14B1 by using the calculated "first correction value", and sets a new "first delay amount set value" to the delay adjustment processing unit 14B1. In the case where the delay amount set value of the delay adjustment processing unit 14B1 is reset at the start of "calibration" as described above, the new "first delay amount set value" is the "first correction value". In this case, the new first delay amount set value is "$-(\Delta S2-\Delta S1)$".

The amount of delay in the second transmission system after "calibration" is the sum of the new first delay amount set value "$-(\Delta S2-\Delta S1)$" and the amount of delay $\Delta S2$ in the transmission radio processing unit 12-1, and it is the amount of delay "$\Delta S1$". Therefore, as a result of "calibration", the amount of delay in the second transmission system becomes equal to the amount of delay in the first transmission system.

As described above, according to the first example embodiment, the control unit (control device) 17 causes the transmission radio processing unit 12-1 in the first transmission system to transmit the first transmitting-end clock transmission signal. The transmission control unit 17A causes the transmission radio processing unit 12-2 in the second transmission system to transmit the second transmitting-end clock transmission signal. The transmission control unit 17A causes the transmission radio processing unit 12-1 in the first transmission system to transmit the third transmitting-end clock transmission signal. The control unit (control device) 17 acquires information about the "first phase value" and the "second phase value". The "first phase value" is a phase value of the "second transmitting-end clock transmission signal" received in the second reception system that operates based on the receiving-end clock signal that is synchronous with the transmitting-end clock signal by the "first transmitting-end clock transmission signal". This "first phase value" is a phase value that is extracted by the clock recovery processing unit 33A-2 in the second reception system. The "second phase value" is a phase value of the "third transmitting-end clock transmission signal" received in the second reception system that operates based on the receiving-end clock signal that is synchronous with the transmitting-end clock signal by the "first transmitting-end clock transmission signal". This "second phase value" is a phase value that is extracted by the clock recovery processing unit 33A-2 in the second reception system. The control unit (control device) 17 calculates the "first correction value" for correcting the "first delay amount set value" that is set to the delay adjustment processing unit 14B1 based on the acquired information about the "first phase value" and the "second phase value".

This configuration of the control unit (control device) 17 allows the amount of delay in the first transmission system and the amount of delay in the second transmission system in the MIMO transmission device 10 to become equal. The timing of transmission in a plurality of transmission systems in the MIMO transmission device 10 is thereby aligned, which improves the reception accuracy in MIMO transmission.

Second Example Embodiment

A second example embodiment is related to an example embodiment using a first channel and a second channel which is independent of the first channel. The basic configurations of a communication system, a MIMO transmission device and a MIMO reception device in the second example embodiment are the same as those in the first example embodiment, and therefore they are described with reference to FIGS. 1, 2 and 3. Points different from those of the first example embodiment are particularly described hereinbelow.

<Overview of Communication System>

In the communication system 1 according to the second example embodiment, the "first reception system" corresponds to a "first channel" and does not correspond to a "second channel" which is independent of the "first channel". The "second reception system" corresponds to both of the first channel and the second channel. The "first transmitting-end clock transmission signal" and the "third transmitting-end clock transmission signal" are transmitted using the "first channel". The "second transmitting-end clock transmission signal" is transmitted using the "second channel". The "first channel" has a first frequency, and the "second channel" has a second frequency whose interference level with the first frequency is lower than a specified level. Alternatively, the "first channel" may have a first polarization, and the "second channel" may have a second polarization whose interference level with the first polarization is lower than a specified level.

<Configuration Example of MIMO Transmission Device>

The control unit (control device) 17 of the MIMO transmission device 10 according to the second example embodiment causes the transmission radio processing unit 12-1 in the first transmission system to transmit the transmitting-end clock transmission signal through the "first channel" in a "first transmission period". The transmitting-end clock transmission signal transmitted in the "first transmission period" corresponds to the first transmitting-end clock transmission signal in the first example embodiment.

Then, in a "second transmission period", the control unit (control device) 17 causes the transmission radio processing unit 12-1 in the first transmission system to transmit the transmitting-end clock transmission signal again through the "first channel". In the "second transmission period", the control unit (control device) 17 causes the transmission radio processing unit 12-2 in the second transmission system to transmit the transmitting-end clock transmission signal. Thus, in the "second transmission period", transmission of the transmitting-end clock transmission signal through the first channel and transmission of the transmitting-end clock transmission signal through the second channel are performed in parallel. Because the first channel and the second channel are independent of each other as described above, it can be regarded that interference does not occur even if the transmitting-end clock transmission signals are transmitted through the both channels in the same time period. The "second transmission period" is a time period that is later than the "first transmission period". The transmitting-end clock transmission signal that is transmitted through the second channel in the "second transmission period" corresponds to the second transmitting-end clock transmission signal in the first example embodiment.

Then, in a "third transmission period", the control unit (control device) 17 causes the transmission radio processing unit 12-1 in the first transmission system to transmit the transmitting-end clock transmission signal again through the "first channel". The "third transmission period" is a time period that is later than the "second transmission period". The transmitting-end clock transmission signal that is transmitted through the first channel in the "third transmission period" is used also as the third transmitting-end clock transmission signal in the first example embodiment.

As described above, the MIMO transmission device 10 according to the second example embodiment transmits the transmitting-end clock transmission signal from the first transmission system through the first channel in each transmission period, and transmits the transmitting-end clock transmission signal from the second transmission system through the second channel in the second transmission period.

Then, the control unit (control device) 17 calculates the "first correction value" for correcting the "first delay amount set value" that is set to the delay adjustment processing unit 14B1 based on the acquired information about the "first phase value" and the "second phase value", in the same manner as in the first example embodiment. The control unit (control device) 17 then corrects the "first delay amount set value" of the delay adjustment processing unit 14B1 by using the calculated "first correct value", and sets a new "first delay amount set value" to the delay adjustment processing unit 14B1.

<Configuration Example of MIMO Reception Device>

As described above, the first reception system of the MIMO reception device 30 according to the second example embodiment corresponds to the "first channel" and does not correspond to the "second channel" which is independent of the "first channel". Thus, the clock recovery processing unit 33A-1 receives the transmitting-end clock transmission signal transmitted from the "first transmission period" in each of the above-described transmission periods via the antenna 31-1 and the reception radio processing unit 32-1. The clock recovery processing unit 33A-1 extracts the phase value of the transmitting-end clock transmission signal from the first transmission system transmitted in each transmission period, and outputs the extracted phase value to the clock generation unit 34. The synchronization between the transmitting-end clock signal and the receiving-end clock signal is thereby continuously maintained with high accuracy.

Further, the clock recovery processing unit 33A-2 that is in "synchronous operation" receives the transmitting-end clock transmission signal transmitted from the "second transmission system" through the second channel in the "second transmission period" via the antenna 31-2 and the reception radio processing unit 32-2. The transmitting-end clock transmission signal that is transmitted through the second channel in the "second transmission period" corresponds to the second transmitting-end clock transmission signal in the first example embodiment. The clock recovery processing unit 33A-2 extracts the "first phase value" in the same manner as in the first example embodiment.

Furthermore, the clock recovery processing unit 33A-2 that is in "synchronous operation" receives the transmitting-end clock transmission signal transmitted from the "first transmission system" through the first channel in the "third transmission period" via the antenna 31-2 and the reception radio processing unit 32-2. The transmitting-end clock transmission signal that is transmitted through the first channel in the "third transmission period" is used also as the third transmitting-end clock transmission signal in the first example embodiment. The clock recovery processing unit 33A-2 extracts the "second phase value" in the same manner as in the first example embodiment.

As described above, according to the second example embodiment, in the communication system 1, the "first reception system" corresponds to the "first channel" and does not correspond to the "second channel" which is independent of the "first channel". The "second reception system" corresponds to both of the first channel and the second channel. The control unit (control device) 17 transmits the "first transmitting-end clock transmission signal" and the "third transmitting-end clock transmission signal"

through the "first channel". The control unit (control device) 17 transmits the "second transmitting-end clock transmission signal" through the "second channel".

This configuration of the control unit (control device) 17 reduces interference between the transmitting-end clock transmission signal transmitted from the first transmission system and the transmitting-end clock transmission signal transmitted from the second transmission system.

Third Example Embodiment

A third example embodiment is different from the first example embodiment and the second example embodiment, and it is an example embodiment related to a case where the number of antennas to be used for MIMO transmission in the MIMO transmission device is three, and the number of antennas to be used for MIMO reception in the MIMO reception device is three. Differences from the first example embodiment are mainly described hereinbelow.

<Configuration Example of MIMO Transmission Device>

Figure 4:
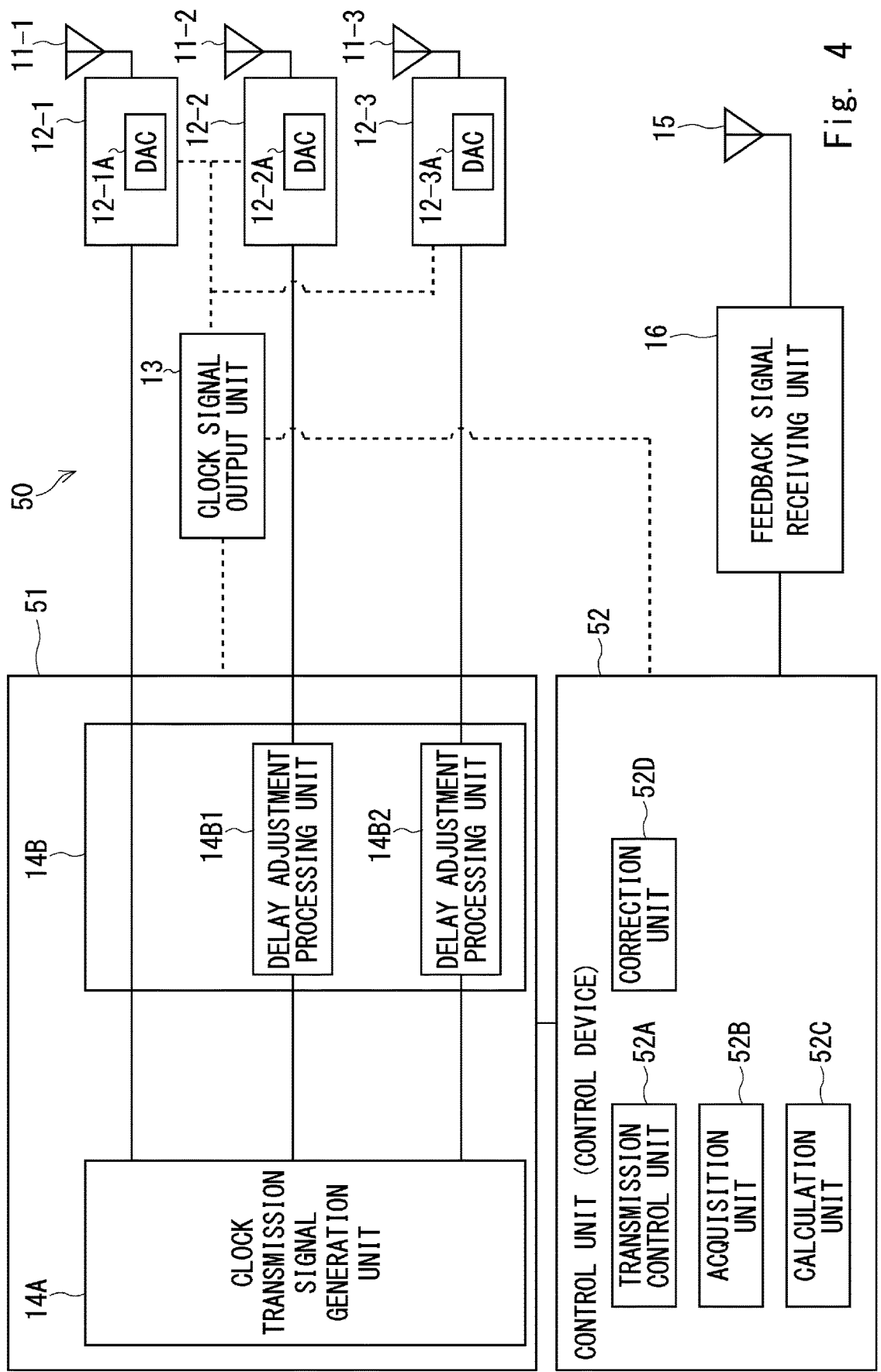
FIG. 4 is a block diagram showing an example of a MIMO transmission device that includes a control device according to a third example embodiment.

FIG. 4 is a block diagram showing an example of a MIMO transmission device that includes a control device according to the third example embodiment. In FIG. 4, a MIMO transmission device 50 includes an antenna 11-3, a transmission radio processing unit 12-3, a signal processing unit 51, and a control unit (control device) 52. A delay amount adjustment unit 14B in the signal processing unit 51 includes a delay adjustment processing unit 14B2. The antenna 11-3, the transmission radio processing unit 12-3, and the delay adjustment processing unit 14B2 are included in a "third transmission system".

The delay adjustment processing unit 14B2 is placed in the input stage of the transmission radio processing unit 12-3 in the "third transmission system". The delay adjustment processing unit 14B2 adjusts the amount of delay of a "transmitting-end clock transmission signal (fourth transmitting-end clock transmission signal)" to be input to the transmission radio processing unit 12-3 based on the "delay amount set value (second delay amount set value)".

The transmission radio processing unit 12-3 transmits a radio signal obtained by performing transmission radio processing on an input signal via the antenna 11-3. The transmission radio processing unit 12-3 includes a digital-to-analog converter (DAC) 12-3A. The transmission radio processing unit 12-3 may include an analog circuit other than the digital-to-analog converter 12-3A.

The feedback signal receiving unit 16 receives, via the antenna 15, a "feedback signal" transmitted via the antenna 36 from a MIMO reception device 70, which is described later, and outputs it to the control unit 52 in the same manner as in the first example embodiment. By this "feedback signal", information about a "third phase value", in addition to information about the "first phase value" and the "second phase value", is fed back from the MIMO reception device 70. The "third phase value" is a phase value of the "fourth transmitting-end clock transmission signal" received in the second reception system that operates based on a receiving-end clock signal that is synchronous with the transmitting-end clock signal by the "first transmitting-end clock transmission signal". This "third phase value" is a phase value that is extracted by the clock recovery processing unit 33A-2 in the second reception system.

The control unit (control device) 52 includes a transmission control unit 52A, an acquisition unit 52B, a calculation unit 52C, and a correction unit 52D as shown in FIG. 4.

The transmission control unit 52A performs transmission control of the first transmitting-end clock transmission signal, the second transmitting-end clock transmission signal, and the third transmitting-end clock transmission signal, just like the transmission control unit 17A in the first example embodiment. The transmission control unit 52A further causes the transmission radio processing unit 12-3 in the third transmission system to transmit a "transmitting-end clock transmission signal (fourth transmitting-end clock transmission signal)".

The acquisition unit 52B acquires the information about the "first phase value" and the "second phase value" described above from the "feedback signal" received from the feedback signal receiving unit 16, just like the acquisition unit 17B in the first example embodiment. The acquisition unit 52B further acquires information about the "third phase value" from the "feedback signal" received from the feedback signal receiving unit 16.

The calculation unit 52C calculates the "first correction value" for correcting the "first delay amount set value" that is set to the delay adjustment processing unit 14B1 based on the information about the "first phase value" and the "second phase value" acquired by the acquisition unit 52B, just like the calculation unit 17C in the first example embodiment. The calculation unit 52C further calculates a "second correction value" for correcting the "second delay amount set value" that is set to the delay adjustment processing unit 14B2 based on the information about the "second phase value" and the "third phase value" acquired by the acquisition unit 52B. For example, the calculation unit 52C calculates the "second correction value" by subtracting a "second inverted phase value", which is obtained by inverting the positive/negative sign of the "second phase value", from a "third inverted phase value", which is obtained by inverting the positive/negative sign of the "third phase value".

The correction unit 52D corrects the "first delay amount set value" of the delay adjustment processing unit 14B1 by using the "first correct value" calculated by the calculation unit 52C, and sets a new "first delay amount set value" to the delay adjustment processing unit 14B1, just like the correction unit 17D in the first example embodiment. The correction unit 52D further corrects the "second delay amount set value" of the delay adjustment processing unit 14B2 by using the "second correct value" calculated by the calculation unit 52C, and sets a new "second delay amount set value" to the delay adjustment processing unit 14B2. Ideally, as a result of this correction by the correction unit 52D, the amount of delay in the first transmission system, the amount of delay in the second transmission system, and the amount of delay in the third transmission system become equal.

<Configuration Example of MIMO Reception Device>

Figure 5:
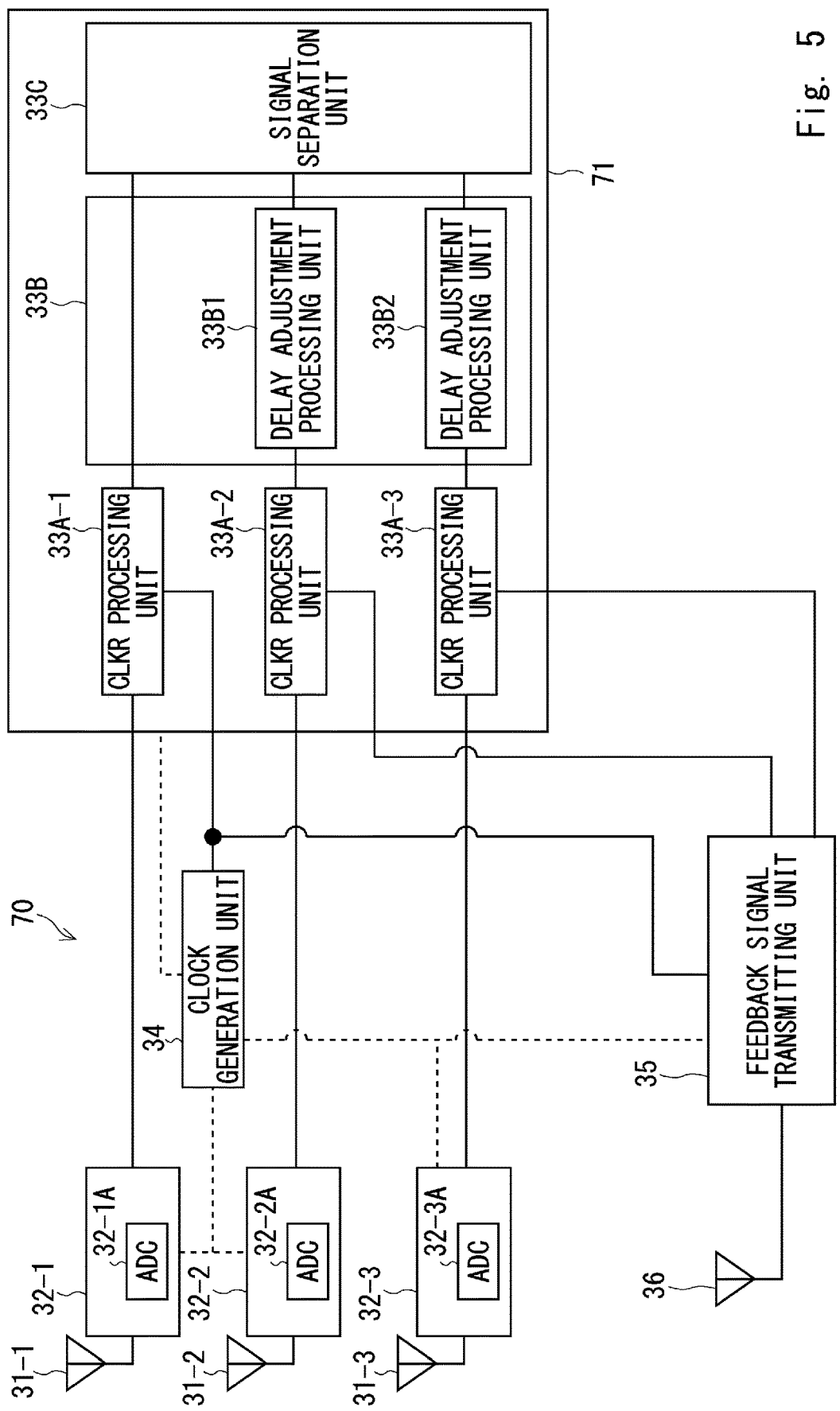
FIG. 5 is a block diagram showing an example of a MIMO reception device according to the third example embodiment.

FIG. 5 is a block diagram showing an example of a MIMO reception device according to the third example embodiment. In FIG. 5, the MIMO reception device 70 includes an antenna 31-3, a reception radio processing unit 32-3, and a signal processing unit 71. The antenna 31-3, the reception radio processing unit 32-3, and a clock recovery processing unit 33A-3 and a delay adjustment processing unit 33B2, which are described later, are included in a "third reception system".

The reception radio processing unit 32-3 outputs, to the signal processing unit 71, a signal after reception radio processing, which is obtained by performing reception radio processing on a signal received via the antenna 31-3. The reception radio processing unit 32-3 includes an analog-to-digital converter (ADC) 32-3A. Note that the reception radio processing unit 32-3 may include an analog circuit other than the analog-to-digital converter 32-3A.

The signal processing unit 71 includes the clock recovery processing unit 33A-3. Further, the delay amount adjustment unit 33B of the signal processing unit 71 includes the delay adjustment processing unit 33B2.

The clock recovery processing unit 33A-2 that is in "synchronous operation" in the third example embodiment receives the "fourth transmitting-end clock transmission signal" transmitted from the "third transmission system" via the antenna 31-2 and the reception radio processing unit 32-2. Then, the clock recovery processing unit 33A-2 extracts a phase value (which is the above-described "third phase value") of the received "fourth transmitting-end clock transmission signal". The clock recovery processing unit 33A-2 then outputs the extracted "third phase value" to the feedback signal transmitting unit 35. This information about the "third phase value" is transmitted to the MIMO transmission device 50 by the feedback signal transmitting unit 35.

The clock recovery processing unit 33A-3 that is in "synchronous operation" receives the "third transmitting-end clock transmission signal" transmitted from the "first transmission system" via the antenna 31-3 and the reception radio processing unit 32-3. Then, the clock recovery processing unit 33A-3 extracts a phase value (which is hereinafter referred to as a "fourth phase value") of the received "third transmitting-end clock transmission signal". The clock recovery processing unit 33A-3 then outputs the extracted "fourth phase value" to the delay adjustment processing unit 33B2.

The delay adjustment processing unit 33B2 adjusts the amount of delay of an input signal based on the "delay amount set value", and outputs it to the signal separation unit 33C. The delay adjustment processing unit 33B2 uses, as the "delay amount set value", a "fourth inverted phase value" obtained by inverting the positive/negative sign of the "fourth phase value" received from the clock recovery processing unit 33A-3.

The feedback signal transmitting unit 35 according to the third example embodiment transmits the information about the "first phase value" and the "second phase value" as a feedback signal to the MIMO transmission device 50 via the antenna 36 in the same manner as in the first embodiment. The feedback signal transmitting unit 35 according to the third example embodiment further transmits the above-described information about the "third phase value" as a feedback signal to the MIMO transmission device 50 via the antenna 36.

<Operation Example of Communication System>

An example of the processing operation of a communication system that includes the MIMO transmission device 50 and the MIMO reception device 70 having the above-described configurations is described hereinafter. In the following example, a processing operation in "calibration" is described. Differences from the first example embodiment are mainly described hereinbelow.

It is assumed that the amount of delay in the transmission radio processing unit 12-3 is $\Delta S3$. Thus, before "calibration" is performed, the amount of delay in the third transmission system is $\Delta S3$. It is also assumed that the amount of delay in the reception radio processing unit 32-3 is $\Delta t3$.

A process until making the amount of delay in the first transmission system and the amount of delay in the second transmission system equal to each other in the communication system according to the third example embodiment is the same as that in the first example embodiment.

The clock recovery processing unit 33A-2 that is in "synchronous operation" receives the "fourth transmitting-end clock transmission signal" transmitted from the "third transmission system" via the antenna 31-2 and the reception radio processing unit 32-2. The clock recovery processing unit 33A-2 is in "synchronous operation". Thus, the "fourth transmitting-end clock transmission signal" transmitted from the "third transmission system" is delayed by the amount of delay "$(\Delta S3+\Delta t2)-(\Delta S1+\Delta t1)$" and received by the clock recovery processing unit 33A-2. Thus, the clock recovery processing unit 33A-2 extracts "$(\Delta S3+\Delta t2)-(\Delta S1+\Delta t1)$" as the "third phase value" of the "fourth transmitting-end clock transmission signal".

The feedback signal transmitting unit 35 then transmits information about the "third phase value" to the MIMO transmission device 50. The transmitted information about the "third phase value" is acquired by the control unit 52 via the antenna 15 and the feedback signal receiving unit 16.

After that, the control unit 52 in the MIMO transmission device 50 calculates the "second correction value" for correcting the "second delay amount set value" that is set to the delay adjustment processing unit 14B2 based on the acquired information about the "second phase value" and the "third phase value". To be specific, the control unit 52 calculates the "second correction value" by subtracting the "second inverted phase value", which is obtained by inverting the positive/negative sign of the "second phase value", from the "third inverted phase value", which is obtained by inverting the positive/negative sign of the "third phase value". With use of the second phase value "$\Delta t2-\Delta t1$" and the third phase value "$(\Delta S3+\Delta t2)-(\Delta S1+\Delta t1)$" described above, the "second correction value" is "$-(\Delta S3-\Delta S1)$".

Then, the control unit 52 corrects the "second delay amount set value" of the delay adjustment processing unit 14B2 by using the calculated "second correction value", and sets a new "second delay amount set value" to the delay adjustment processing unit 14B2. In the case where the delay amount set value of the delay adjustment processing unit 14B2 is reset at the start of "calibration" as described above, the new "second delay amount set value" is the "second correction value". In this case, the new second delay amount set value is "$-(\Delta S3-\Delta S1)$".

The amount of delay in the third transmission system after "calibration" is the sum of the new second delay amount set value "$-(\Delta S3-\Delta S1)$" and the amount of delay $\Delta S3$ in the transmission radio processing unit 12-3, and it is the amount of delay "$\Delta S1$". Therefore, as a result of "calibration", the amount of delay in the third transmission system becomes equal to the amount of delay in the first transmission system and the amount of delay in the second transmission system.

As described above, according to the third example embodiment, the control unit (control device) 52 causes the transmission radio processing unit 12-3 in the third transmission system to transmit the fourth transmitting-end clock transmission signal. Then, the control unit (control device) 52 acquires information about the "third phase value". The "third phase value" is a phase value of the "fourth transmitting-end clock transmission signal" received in the second reception system that operates based on the receiving-end clock signal that is synchronous with the transmitting-end clock signal by the "first transmitting-end clock transmission signal". This "third phase value" is a phase value that is extracted by the clock recovery processing unit 33A-2 in the second reception system. The control unit (control device) 52 then calculates the "second correction value" for correcting the "second delay amount set value" that is set to the delay adjustment processing unit 14B2 based on the acquired information about the "second phase value" and the "third phase value".

This configuration of the control unit (control device) 52 allows the amount of delay in the first transmission system and the amount of delay in the second transmission system in the MIMO transmission device 50 to become equal. The timing of transmission in a plurality of transmission systems in the MIMO transmission device 50 is thereby aligned, which improves the reception accuracy in MIMO transmission.

Fourth Example Embodiment

A fourth example embodiment is related to an example embodiment using a first channel and a second channel which is independent of the first channel, just like the second example embodiment. The basic configurations of a communication system, a MIMO transmission device and a MIMO reception device in the fourth example embodiment are the same as those in the third example embodiment, and therefore they are described with reference to FIGS. 4 and 5. Points different from those of the second example embodiment and the third example embodiment are particularly described hereinbelow.

<Configuration Example of MIMO Transmission Device>

The control unit (control device) 52 of the MIMO transmission device 50 according to the fourth example embodiment performs transmission control of the transmitting-end clock transmission signals in the "first transmission period", the "second transmission period" and the "third transmission period", just like the control unit (control device) 17 in the second example embodiment.

In a "fourth transmission period", the control unit (control device) 52 in the fourth example embodiment causes the transmission radio processing unit 12-1 in the first transmission system to transmit the transmitting-end clock transmission signal again through the "first channel". In the "fourth transmission period", the control unit (control device) 52 in the fourth example embodiment further causes the transmission radio processing unit 12-3 in the third transmission system to transmit the transmitting-end clock transmission signal through the "second channel". The "fourth transmission period" may be earlier or later than the "second transmission period" and the "third transmission period", as long as it is later than the "first transmission period". The transmitting-end clock transmission signal transmitted through the second channel in the "fourth transmission period" corresponds to the fourth transmitting-end clock transmission signal in the third example embodiment.

As described above, the MIMO transmission device 50 according to the fourth example embodiment transmits the transmitting-end clock transmission signal from the first transmission system through the first channel in each transmission period, and transmits the transmitting-end clock transmission signal from the second transmission system through the second channel in the second transmission period. Further, the MIMO transmission device 50 according to the fourth example embodiment transmits the transmitting-end clock transmission signal from the third transmission system through the second channel in the fourth transmission period.

Then, the control unit (control device) 52 calculates the "first correction value" for correcting the "first delay amount set value" that is set to the delay adjustment processing unit 14B1 based on the acquired information about the "first phase value" and the "second phase value". The control unit (control device) 52 then corrects the "first delay amount set value" of the delay adjustment processing unit 14B1 by using the calculated "first correct value", and sets a new "first delay amount set value" to the delay adjustment processing unit 14B1. Further, the control unit (control device) 52 calculates the "second correction value" for correcting the "second delay amount set value" that is set to the delay adjustment processing unit 14B2 based on the acquired information about the "second phase value" and the "third phase value". The control unit (control device) 52 then corrects the "second delay amount set value" of the delay adjustment processing unit 14B2 by using the calculated "second correct value", and sets a new "second delay amount set value" to the delay adjustment processing unit 14B2.

<Configuration Example of MIMO Reception Device>

The third reception system of the MIMO reception device 70 according to the fourth example embodiment corresponds to both of the first channel and the second channel. Processing on the transmitting-end clock transmission signal transmitted from the "first transmission system" in each transmission period in the MIMO reception device 70 according to the fourth example embodiment is the same as that in the second example embodiment. Further, processing on the transmitting-end clock transmission signal transmitted from the "second transmission system" through the second channel in the second transmission period in the MIMO reception device 70 according to the fourth example embodiment is also the same as that in the second example embodiment. Furthermore, processing on the transmitting-end clock transmission signal transmitted from the "first transmission system" through the first channel in the third transmission period in the MIMO reception device 70 according to the fourth example embodiment is also the same as that in the second example embodiment.

In the fourth example embodiment, the clock recovery processing unit 33A-2 that is in "synchronous operation" receives the transmitting-end clock transmission signal transmitted from the "third transmission system" through the second channel in the "fourth transmission period" via the antenna 31-2 and the reception radio processing unit 32-2. The transmitting-end clock transmission signal that is transmitted through the second channel in the "fourth transmission period" corresponds to the fourth transmitting-end clock transmission signal in the third example embodiment. The clock recovery processing unit 33A-2 extracts the "third phase value" in the same manner as in the third example embodiment.

According to the fourth example embodiment, in the communication system, the "first reception system" corresponds to the "first channel" and does not correspond to the "second channel" that is independent of the "first channel". The "second reception system" corresponds to both of the first channel and the second channel. The control unit (control device) 52 transmits the "first transmitting-end clock transmission signal" and the "third transmitting-end clock transmission signal" through the "first channel". The control unit (control device) 52 transmits the "second transmitting-end clock transmission signal" and the "fourth transmitting-end clock transmission signal" through the "second channel".

This configuration of the control unit (control device) 52 reduces interference among the transmitting-end clock transmission signal transmitted from the first transmission system, the transmitting-end clock transmission signal transmitted from the second transmission system, and the transmitting-end clock transmission signal transmitted from the third transmission system.

Other Example Embodiment

Figure 6:
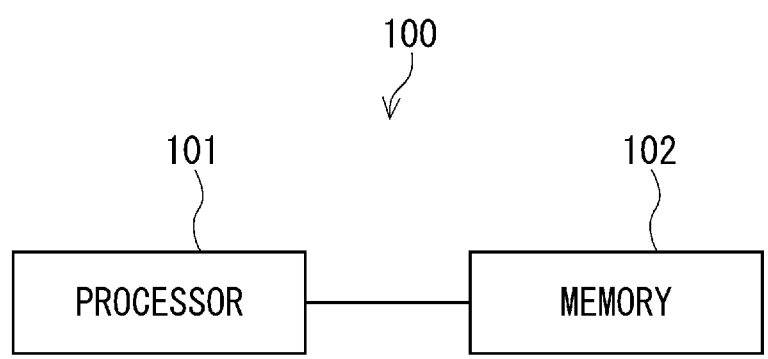
FIG. 6 is a view showing a hardware configuration example of a control device.

FIG. 6 is a view showing a hardware configuration example of a control device. In FIG. 6, the control device 100 includes a processor 101 and a memory 102. The transmission control unit 17A, 52A, the acquisition unit 17B, 52B, the calculation unit 17C, 52C, and the correction unit 17D, 52D included in the control unit (control device) 17, 52 according to the first to fourth example embodiments may be implemented by reading and executing, by the processor 101, a program stored in the memory 102. The program may be stored using various types of non-transitory computer readable media and supplied to the control unit (control device) 17, 52. Alternatively, the program may be supplied to the control unit (control device) 17, 52 by various types of transitory computer readable media.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

Further, a part or the whole of the example embodiments disclosed above can be described as, but not limited to, the following supplementary notes.

(Supplementary Note 1)

A control device for adjusting a difference in delay between a first transmission system and a second transmission system in a MIMO (multiple-input and multiple-output) transmission device including the first transmission system and the second transmission system operating based on a transmitting-end clock signal and being capable of MIMO communication with a MIMO reception device including a first reception system and a second reception system operating based on a receiving-end clock signal, the control device comprising:

a control unit configured to cause a first transmission radio processing unit in the first transmission system to transmit a first transmitting-end clock transmission signal, cause a second transmission radio processing unit in the second transmission system to transmit a second transmitting-end clock transmission signal, cause the first transmission radio processing unit to transmit a third transmitting-end clock transmission signal, acquire, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculate a first correction value for correcting a first delay amount set value set to a delay adjustment unit placed in an input stage of the second transmission radio processing unit in the second transmission system based on the acquired information about the first phase value and the second phase value.

(Supplementary Note 2)

The control device according to Supplementary Note 1, wherein the control unit calculates the first correction value by subtracting a second inverted phase value obtained by inverting a positive/negative sign of the second phase value from a first inverted phase value obtained by inverting a positive/negative sign of the first phase value.

(Supplementary Note 3)

The control device according to Supplementary Note 1 or 2, wherein the MIMO transmission device further includes a third transmission system including a third transmission radio processing unit, the delay adjustment unit further adjusts an amount of delay of a transmitting-end clock transmission signal to be input to the third transmission radio processing unit based on a set second delay amount set value, the control unit causes the third transmission radio processing unit to transmit a fourth transmitting-end clock transmission signal, the control unit acquires information about a third phase value, being a phase value of the fourth transmitting-end clock transmission signal received in the second reception system operating based on the synchronous receiving-end clock signal, extracted by the second clock recovery processing unit, and the control unit calculates a second correction value for correcting the second delay amount set value set to the delay adjustment unit based on the acquired information about the second phase value and the acquired information about the third phase value.

(Supplementary Note 4)

The control device according to Supplementary Note 3, wherein the control unit calculates the second correction value by subtracting a second inverted phase value obtained by inverting a positive/negative sign of the second phase value from a third inverted phase value obtained by inverting a positive/negative sign of the third phase value.

(Supplementary Note 5)

The control device according to any one of Supplementary Notes 1 to 4, wherein the first reception system corresponds to a first channel, and does not correspond to a second channel independent of the first channel, the second reception system corresponds to both of the first channel and the second channel, the first transmitting-end clock transmission signal and the third transmitting-end clock transmission signal are transmitted through the first channel, and the second transmitting-end clock transmission signal is transmitted through the second channel.

(Supplementary Note 6)

The control device according to Supplementary Note 3 or 4, wherein the first reception system corresponds to a first channel, and does not correspond to a second channel independent of the first channel, the second reception system corresponds to both of the first channel and the second channel, the first transmitting-end clock transmission signal and the third transmitting-end clock transmission signal are transmitted through the first channel, and the second transmitting-end clock transmission signal and the fourth transmitting-end clock transmission signal are transmitted through the second channel.

(Supplementary Note 7)

The control device according to Supplementary Note 5 or 6, wherein the first channel has a first frequency, and the second channel has a second frequency where an interference level with the first frequency is lower than a specified level.

(Supplementary Note 8)

The control device according to Supplementary Note 5 or 6, wherein the first channel has a first polarization, and the second channel has a second polarization where an interference level with the first polarization is lower than a specified level.

(Supplementary Note 9)

A MIMO transmission device comprising the control device according to any one of Supplementary Notes 1 to 8.

(Supplementary Note 10)

A delay difference adjustment method performed by a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, the method comprising:

causing a first transmission radio processing unit in the first transmission system to transmit a first transmitting-end clock transmission signal, causing a second transmission radio processing unit in the second transmission system to transmit a second transmitting-end clock transmission signal, causing the first transmission radio processing unit to transmit a third transmitting-end clock transmission signal, acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

(Supplementary Note 11)

A delay difference adjustment program causing a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, to perform processing of causing a first transmission radio processing unit in the first transmission system to transmit a first transmitting-end clock transmission signal, causing a second transmission radio processing unit in the second transmission system to transmit a second transmitting-end clock transmission signal, causing the first transmission radio processing unit to transmit a third transmitting-end clock transmission signal, acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

REFERENCE SIGNS LIST

1 COMMUNICATION SYSTEM
10,50 MIMO TRANSMISSION DEVICE
11-1,11-2,11-3 ANTENNA
12-1,12-2,12-3 TRANSMISSION RADIO PROCESSING UNIT
12-1A,12-2A,12-3A DIGITAL-TO-ANALOG CONVERTER (DAC)
13 CLOCK SIGNAL OUTPUT UNIT
14,51 SIGNAL PROCESSING UNIT
14A CLOCK TRANSMISSION SIGNAL GENERATION UNIT
14B DELAY AMOUNT ADJUSTMENT UNIT
14B1,14B2 DELAY ADJUSTMENT PROCESSING UNIT
15 ANTENNA
16 FEEDBACK SIGNAL RECEIVING UNIT
17,52 CONTROL UNIT (CONTROL DEVICE)
17A,52A TRANSMISSION CONTROL UNIT
17B,52B ACQUISITION UNIT
17C,52C CALCULATION UNIT
17D,52D CORRECTION UNIT
30,70 MIMO RECEPTION DEVICE
31-1,31-2,31-3 ANTENNA
32-1,32-2,32-3 RECEPTION RADIO PROCESSING UNIT
32-1A,32-2A,32-3A ANALOG-TO-DIGITAL CONVERTER (ADC)
33,71 SIGNAL PROCESSING UNIT
33A-1,33A-2,33A-3 CLOCK RECOVERY (CLKR) PROCESSING UNIT
33B DELAY AMOUNT ADJUSTMENT UNIT
33B1,33B2 DELAY ADJUSTMENT PROCESSING UNIT
33C SIGNAL SEPARATION UNIT
34 CLOCK GENERATION UNIT
35 FEEDBACK SIGNAL TRANSMITTING UNIT
36 ANTENNA

The invention claimed is:

1. A control device for adjusting a difference in delay between a first transmission system and a second transmission system in a MIMO (multiple-input and multiple-output) transmission device including the first transmission system and the second transmission system operating based on a transmitting-end clock signal and being capable of MIMO communication with a MIMO reception device including a first reception system and a second reception system operating based on a receiving-end clock signal, the control device comprising:

hardware including a processor and a memory; and
a control unit implemented at least by the hardware and that
causes a first transmission radio processing unit in the first transmission system to transmit a first transmitting-end clock transmission signal,
causes a second transmission radio processing unit in the second transmission system to transmit a second transmitting-end clock transmission signal,
causes the first transmission radio processing unit to transmit a third transmitting-end clock transmission signal,
acquires, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and
calculates a first correction value for correcting a first delay amount set value set to a delay adjustment unit placed in an input stage of the second transmission radio processing unit in the second transmission system based on the acquired information about the first phase value and the second phase value.

2. The control device according to claim 1, wherein the control unit calculates the first correction value by subtracting a second inverted phase value obtained by inverting a positive/negative sign of the second phase value from a first inverted phase value obtained by inverting a positive/negative sign of the first phase value.

3. The control device according to claim 1, wherein
the MIMO transmission device further includes a third transmission system including a third transmission radio processing unit,
the delay adjustment unit further adjusts an amount of delay of a transmitting-end clock transmission signal to be input to the third transmission radio processing unit based on a set second delay amount set value,
the control unit causes the third transmission radio processing unit to transmit a fourth transmitting-end clock transmission signal,
the control unit acquires information about a third phase value, being a phase value of the fourth transmitting-end clock transmission signal received in the second reception system operating based on the synchronous receiving-end clock signal, extracted by the second clock recovery processing unit, and
the control unit calculates a second correction value for correcting the second delay amount set value set to the delay adjustment unit based on the acquired information about the second phase value and the acquired information about the third phase value.

4. The control device according to claim 3, wherein the control unit calculates the second correction value by subtracting a second inverted phase value obtained by inverting a positive/negative sign of the second phase value from a third inverted phase value obtained by inverting a positive/negative sign of the third phase value.

5. The control device according to claim 3, wherein
the first reception system corresponds to a first channel, and does not correspond to a second channel independent of the first channel,
the second reception system corresponds to both of the first channel and the second channel,
the first transmitting-end clock transmission signal and the third transmitting-end clock transmission signal are transmitted through the first channel, and
the second transmitting-end clock transmission signal and the fourth transmitting-end clock transmission signal are transmitted through the second channel.

6. The control device according to claim 1, wherein
the first reception system corresponds to a first channel, and does not correspond to a second channel independent of the first channel,
the second reception system corresponds to both of the first channel and the second channel,
the first transmitting-end clock transmission signal and the third transmitting-end clock transmission signal are transmitted through the first channel, and
the second transmitting-end clock transmission signal is transmitted through the second channel.

7. The control device according to claim 6, wherein
the first channel has a first frequency, and
the second channel has a second frequency where an interference level with the first frequency is lower than a specified level.

8. The control device according to claim 6, wherein
the first channel has a first polarization, and
the second channel has a second polarization where an interference level with the first polarization is lower than a specified level.

9. A delay difference adjustment method performed by a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, the method comprising:
causing a first transmission radio processing unit in the first transmission system to transmit a first transmitting-end clock transmission signal,
causing a second transmission radio processing unit in the second transmission system to transmit a second transmitting-end clock transmission signal,
causing the first transmission radio processing unit to transmit a third transmitting-end clock transmission signal,
acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

10. A non-transitory computer readable medium storing a delay difference adjustment program causing a control device for adjusting a difference in delay between a first transmission system and a second transmission system in a MIMO transmission device including the first transmission system and the second transmission system operating based on a transmitting-end clock signal and being capable of MIMO communication with a MIMO reception device including a first reception system and a second reception system operating based on a receiving-end clock signal, to perform processing of causing a first transmission radio processing unit in the first transmission system to transmit a first transmitting-end clock transmission signal, causing a second transmission radio processing unit in the second transmission system to transmit a second transmitting-end clock transmission signal, causing the first transmission radio processing unit to transmit a third transmitting-end clock transmission signal, acquiring, from the MIMO reception device, information about a first phase value, being a phase value of the second transmitting-end clock transmission signal received in the second reception system operating based on the receiving-end clock signal synchronous with the transmitting-end clock signal by the first transmitting-end clock transmission signal, extracted by a second clock recovery processing unit in the second reception system, and a second phase value, being a phase value of the third transmitting-end clock transmission signal received in the second reception system operating based on the synchronous receiving-end clock signal, extracted by the second clock recovery processing unit in the second reception system, and calculating a first correction value for correcting a first delay amount set value set to a delay adjustment unit placed in an input stage of the second transmission radio processing unit in the second transmission system based on the acquired information about the first phase value and the second phase value.

\* \* \* \* \*